United States Patent [19]

Nakashima et al.

[11] Patent Number: 5,176,756
[45] Date of Patent: Jan. 5, 1993

[54] METHOD FOR FABRICATING A SEMICONDUCTOR DEVICE INCLUDING A STEP FOR CLEANING A SEMICONDUCTOR SUBSTRATE

[75] Inventors: Kazushi Nakashima, Kasugai; Masanori Kobayashi; Tsutomu Ogawa, both of Kawasaki, all of Japan

[73] Assignees: Fujitsu Limited, Kanagawa; Fujitsu VLSI Limited, Aichi, both of Japan

[21] Appl. No.: 750,582

[22] Filed: Aug. 28, 1991

[30] Foreign Application Priority Data

Aug. 29, 1990 [JP] Japan .................. 2-225419

[51] Int. Cl.$^5$ .................. C03C 23/00; C03C 15/00; B08B 1/00; B44C 1/22
[52] U.S. Cl. .................. 134/2; 134/19; 156/657; 156/662
[58] Field of Search .................. 156/647, 657, 662; 134/2, 3, 19, 22.13, 22.17, 29

[56] References Cited

FOREIGN PATENT DOCUMENTS 62-139335  6/1987  Japan.
2-307277  12/1990  Japan.

OTHER PUBLICATIONS

"A Mechanistic Study of Silicon Etching in NH$_3$/H$_2$O$_2$ Cleaning Solutions", van den Meerakker et al, Journal of the Electrochemical Society, vol. 137, No. 4, Apr., 1990, pp. 1239–1243.
"Etching Process of Si Wafers During NH$_4$OH Cleaning" Tanaka et al, Extended Abstracts, vol. 90-1, May 6-10, 1990, pp. 689–690.
"Oxidation Process of Si Wafer During NH$_4$OH Cleaning", Sakurai et al, Extended Abstracts, vol. 90-1, May 6-11, 1990, pp. 710–711.
"Purifying Si and SiO$_2$ Surfaces with Hydrogen Peroxide", Kern, Semiconductor International, vol. 7, No. 4, Apr., 1984, pp. 94–99.
"Cleaning Solutions Based on Hydrogen Peroxide for use in Silicon Semiconductor Technology", Kern et al, RCA Review, vol. 31, No. 2, Jun. 1970, pp. 187–206.

Primary Examiner—William A. Powell
Attorney, Agent, or Firm—Nikaido, Marmelstein, Murray & Oram

[57] ABSTRACT

A method for fabricating a semiconductor device comprises the steps of cleaning a semiconductor substrate in a cleaning liquid essentially consisted of a mixture of an ammonia water having a composition of 29 percent by weight, a hydrogen peroxide aqueous solution having a composition of 31 percent by weight and a deionized water. The cleaning liquid contains the ammonia water and the hydrogen peroxide aqueous solution with respective volume parts such that the volume part of the ammonia is set equal to or smaller than 30 parts with respect to the deionized water of 1000 parts, the volume part of the ammonia water is set equal to or smaller than the volume part of the hydrogen peroxide aqueous solution, and the volume part of the hydrogen peroxide aqueous solution is set equal to or smaller than 100 parts with respect to the deionized water of 1000 parts. The volume part of the hydrogen peroxide aqueous solution is further set equal to or smaller than a boundary composition Y2 represented as $$Y_2 = 0.25 X_3 - 2.75 X_2 + 13.5 X - 10.$$

where X represents the volume part of the ammonia water in 1000 parts of the deionized water.

8 Claims, 8 Drawing Sheets

FIG. 7(C) CLEANING

METHOD FOR FABRICATING A SEMICONDUCTOR DEVICE INCLUDING A STEP FOR CLEANING A SEMICONDUCTOR SUBSTRATE

BACKGROUND OF THE INVENTION

The present invention generally relates to the fabrication process of semiconductor devices, and more particularly to a process for cleaning a semiconductor substrate by a cleaning liquid.

With the increasing integration density and decreasing pattern width in the recent integrated circuits, the problem of deposition of minute silicon oxide particles or silicon particles on the semiconductor substrate during the fabrication process of the semiconductor devices is becoming an acute problem. When these particles are deposited on a semiconductor substrate, various problems occur particularly in the step of photolithographic exposure and patterning. The silicon oxide particles and the silicon particles are formed as a result of the fabrication process of the semiconductor substrates. In order to achieve a high yield and hence low fabrication cost of semiconductor devices, it is essential to remove these particles from the surface of the semiconductor substrate before starting the fabrication process of the semiconductor device.

Conventionally, the use of a cleaning liquid comprising a mixture of ammonia water (aqueous ammonia), hydrogen peroxide aqueous solution and deionized water is known for this purpose. Thereby, ammonia acts as a mild etchant for separating the particles that are bonded to the surface of the substrate, while hydrogen peroxide is believed to act as a mild oxidant for compensating the etching action of ammonia. Typically, ammonia water of 29 wt % composition for industrial use and hydrogen peroxide aqueous solution of 31 wt % composition also for industrial use are mixed with deionized water with a volume ratio of 1:1:5.

Next, a conventional process for removing the particles from the silicon substrate by the foregoing cleaning liquid will be described for the case of a p-type silicon wafer of four inch diameter and a resistivity of 10 Ωcm. The silicon wafer has a (100) oriented crystal surface. In some cases, a silicon oxide layer may be formed on the surface by a thermal oxidation process that is typically conducted at 950° C. in a dry oxygen environment.

When removing the particles of silicon oxide or silicon from the surface, the silicon wafer is dipped in the foregoing liquid mixture of ammonia water, hydrogen peroxide aqueous solution and deionized water held at about 80° C. for 10 minutes. After pulling out from the liquid mixture, the wafer is rinsed by deionized water for 10 minutes and dried subsequently for 15 minutes. As a result of the dipping into the liquid mixture, the surface of the substrate is etched slightly and the particles deposited on the surface of the substrate are separated from the surface.

In one experiment, it was found that the surface of the silicon oxide layer covering the surface of the silicon wafer is etched for a depth of 32 Å. When the silicon wafer is not covered by the silicon oxide layer and the (100) crystal surface of silicon is exposed, on the other hand, the surface of the substrate was etched for a depth of about 75 Å. The result of particle counting conducted for the particles that are remaining on the surface of the substrate and having the diameter of larger than about 0.3 μm showed that about 94 percent of the silicon oxide particles are removed from any of the silicon oxide surface and the silicon surface, while the silicon particles are removed by only 36 percent.

When fabricating the integrated circuits having submicron patterns, the foregoing result of the removal of particles is not sufficient for both the silicon particles and silicon oxide particles. Further, the amount of etching that is made at the time of cleaning in the liquid mixture is generally too much for the submicron integrated circuits. In addition, the use of conventional liquid mixture for the cleaning liquid causes the problem of environmental pollution because of the large amount of waste ammonia formed at the time of processing. The use of large amount of hydrogen peroxide and ammonia water of course increases the cost of the fabricated integrated circuits.

SUMMARY OF THE INVENTION

Accordingly, it is a general object of the present invention to provide a novel and useful process for fabricating a semiconductor device wherein the foregoing problems are eliminated.

Another and more specific object of the present invention is to provide a process for fabricating a semiconductor device including the step of cleaning a semiconductor substrate in a cleaning liquid to remove particles of silicon oxide and silicon, wherein the removal of the particles is achieved efficiently for both the silicon oxide particles and the silicon particles.

Another object of the present invention is to provide a process for fabricating a semiconductor device including the step of cleaning a semiconductor substrate in a cleaning liquid to remove particles of silicon oxide and silicon, wherein the efficiency for the removal of the silicon and silicon oxide particles from the semiconductor substrate is improved, the amount of etching made to the surface of the semiconductor body is reduced, and the amount of the ammonia and hydrogen peroxide aqueous solutions used in the cleaning liquid is reduced.

Another object of the present invention is to provide a new composition of a cleaning liquid used for removing particles of silicon and silicon oxide from a surface of a semiconductor body.

Another object of the present invention is to provide a composition of the cleaning liquid for removing particles of silicon and silicon oxide from a silicon surface or a silicon oxide surface, said cleaning liquid containing ammonia water of 29 wt % with a volume of less than 30 parts in the deionized water of 1000 parts, hydrogen peroxide aqueous solution of 31 wt % with a volume of less than 100 parts but larger than 5 parts in the deionized water of 1000 parts, hydrogen peroxide aqueous solution being contained in the cleaning liquid with a volume fraction set equal to or larger than the volume fraction of the ammonia water but smaller than a boundary composition Y2 representing the volume part of the hydrogen peroxide aqueous solution in 1000 parts of said deionized water, said boundary Y2 being defined as $$Y_2 = 0.25X^3 - 2.75X^2 + 13.5X - 10,$$

where X represents the volume part of the ammonia water in 1000 parts of said deionized water. According to the present invention, the deterioration of the breakdown voltage of silicon oxide films formed on the surface of the silicon surface is minimized by setting the volume of the ammonia water to be less than 30 parts as set forth above. Associated with the foregoing setting of the volume content of the ammonia water, one can eliminate also the problem of excessive etching of the silicon surface or the silicon oxide film. By setting the volume of the hydrogen peroxide aqueous solutions to be less than 100 parts as set forth above, one can suppress the deposition of aluminum particles that are contained in hydrogen peroxide aqueous solution as a by-product, to a level sufficient to avoid problems occurring in the integrated circuit. Further, by setting the volume content of the hydrogen peroxide aqueous solution to the level exceeding 5 parts in 1000 part deionized water, one can obtain a sufficient effect of the cleaning liquid. Furthermore, by setting the content of the hydrogen peroxide aqueous solution to a level below the foregoing level Y2, one can guarantee the sufficient effect of the cleaning liquid for separating the particles from the surface of the semiconductor body by etching.

Further, the object of the present invention will become apparent from the following detailed description of the preferred embodiments when read in conjunction with the attached drawings.

DETAILED DESCRIPTION

In the research that forms the foundation of the present invention, the inventors have made a series of extensive experiments to remove the particles of silicon and silicon oxide from the surface of a silicon substrate by dipping the substrate into a cleaning liquid of a mixture of an ammonia water, a hydrogen peroxide aqueous solution and deionized water, while changing the mixing ratio of the ammonia water, the hydrogen peroxide aqueous solution and the deionized water variously In each experiment, the silicon substrate was dipped into the cleaning solution that is held at 80° C. After cleaning, the substrate was pulled up and rinsed for 10 minutes in the deionized water and dried for 15 minutes.

Figure 1:
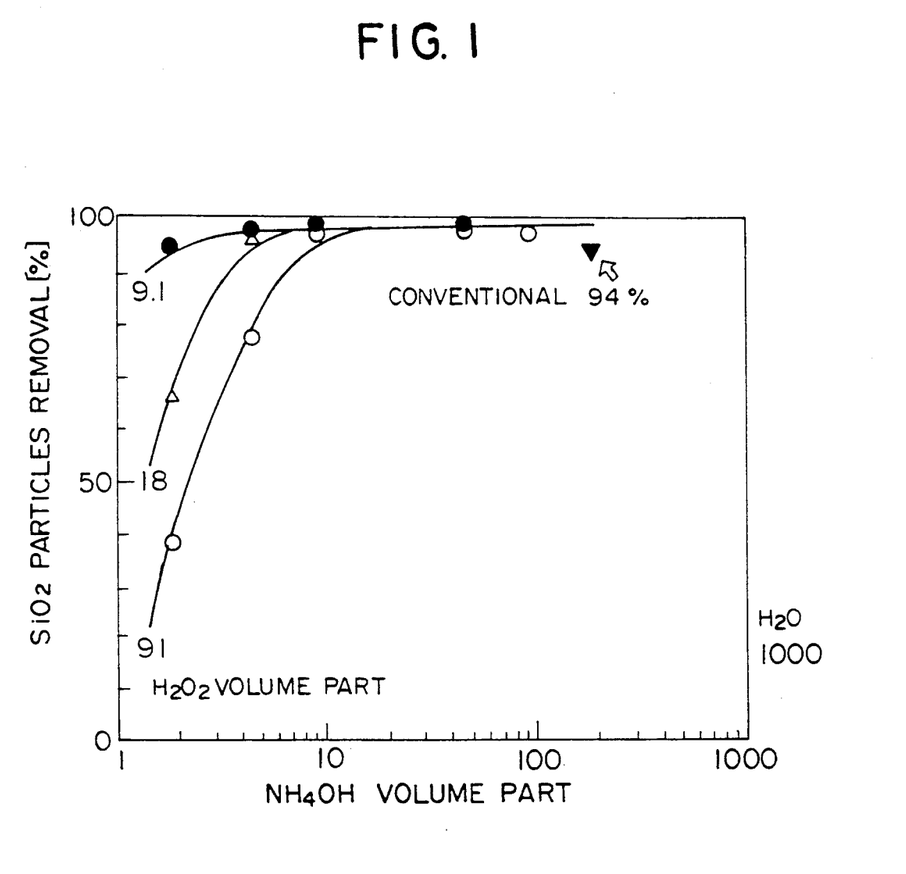
FIG. 1 is a diagram showing the relationship between the efficiency of removal of silicon oxide particles from the surface of a silicon substrate and the volume content of the ammonia water contained in the cleaning liquid while changing the volume content of the hydrogen peroxide aqueous solution in the cleaning liquid variously.

FIG. 1 shows the relationship between the efficiency of removal of the silicon oxide particles from the surface of the silicon substrate and the volume content or volume part of the ammonia water in the cleaning liquid. In FIG. 1, the relationship is shown for various volume content of the hydrogen peroxide aqueous solution in the cleaning liquid. In the present experiment, an ammonia water of 29 wt % composition for industrial use was used for the cleaning liquid. Further, a hydrogen peroxide aqueous solution of 31 wt % composition also for industrial use was used for the cleaning liquid. The efficiency of removal was calculated based upon the counting of the number of particles larger than about 0.3 $\mu$m in diameter and remaining on the surface of the substrate after the cleaning. In FIG. 1, the volume ratio of the ammonia water and the hydrogen peroxide aqueous solution is represented in the form of volume part with respect to 1000 part deionized water.

As can be seen clearly in FIG. 1, the efficiency of removal of the particles increases generally with the decrease in the volume part of the hydrogen peroxide aqueous solution and the increase in the volume part of the ammonia water. Particularly, it is clearly demonstrated that one can obtain the efficiency of removal exceeding the conventional efficiency of about 94% while reducing the content of the ammonia water significantly. This effect is particularly conspicuous for the composition of the cleaning liquid in which the hydrogen peroxide aqueous solution is contained with the volume part of 9.1 with respect to 1000 part deionized water. It should be noted that the foregoing conventional efficiency of 94% is obtained by the conventional cleaning liquid mentioned previously that contains the hydrogen peroxide aqueous solution, the ammonia water and the deionized water with the volume ratio of 1:1:5. This conventional liquid contains the ammonia water with the volume of 200 parts with respect to the 1000 part deionized water.

Figure 2:
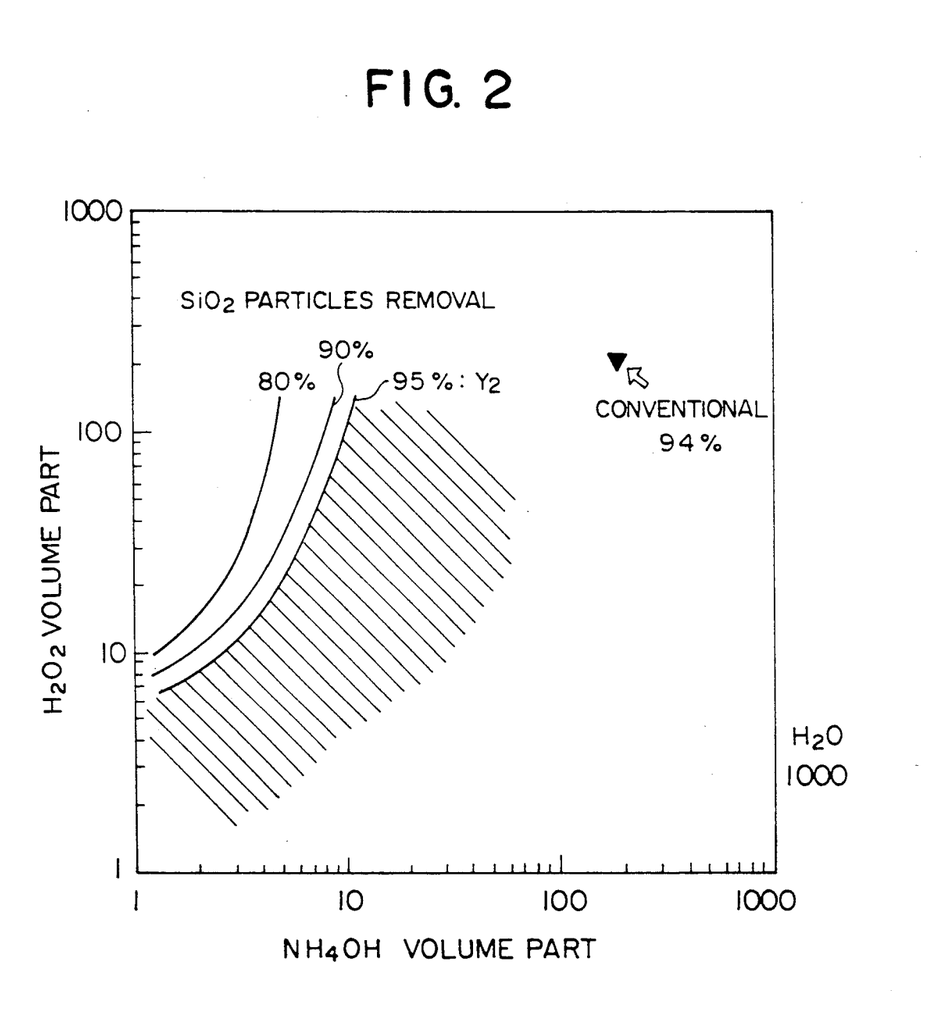
FIG. 2 is a diagram showing the relationship between the volume content of the hydrogen peroxide aqueous solution and the volume content of the ammonia water in the cleaning liquid, with the level of efficiency of removal of the silicon particles as a parameter.

FIG. 2 shows the relationship between the volume part of the ammonia water and the volume part of the hydrogen peroxide aqueous solution, wherein each line represents the efficiency of removal of the silicon oxide particles as a function of the volume part of hydrogen peroxide aqueous solution and the volume part of ammonia water. This diagram is a mere alternative representation of the relationship of FIG. 1, but is useful in showing graphically the preferred compositional range of the cleaning liquid.

In FIG. 2, the range of composition of the cleaning liquid that provides the efficiency of removal exceeding 95% is represented by hatching. The boundary composition Y2 is represented approximately as $$Y2 = 0.25X^3 - 2.75X^2 + 13.5X - 10.$$

where Y2 represents the volume part of hydrogen peroxide aqueous solution with respect to 1000 part deionized water, and X represents the volume part of ammonia water with respect to 1000 part deionized water.

Thus, one can guarantee the efficiency of removal of silicon oxide particles of more than 95% by increasing the volume part of the ammonia water beyond the foregoing boundary composition Y2. On the other hand, excessive increase in the volume part of the ammonia water may invite excessive etching of the substrate by the cleaning liquid.

Figure 3:
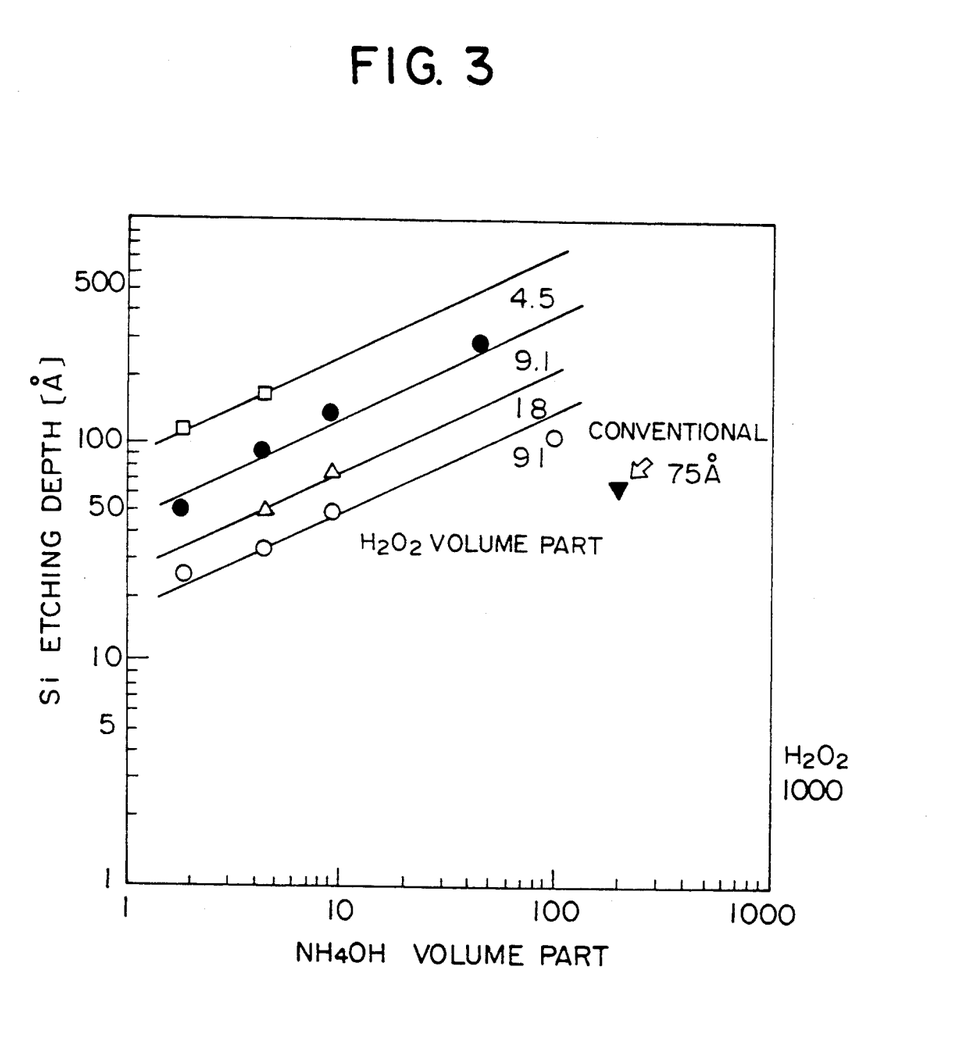
FIG. 3 is a diagram showing the relationship between the depth of etching that is achieved on the silicon substrate by the cleaning liquid and the volume content of the ammonia water contained in the cleaning liquid while changing the volume content of the hydrogen peroxide aqueous solution also contained in the cleaning liquid variously.

FIG. 3 shows the relationship of the etching of the silicon substrate and the composition of the ammonia water contained in the cleaning liquid. In FIG. 3, the composition of the ammonia water is represented by the volume part with respect to the 1000 part deionized water. In FIG. 3, the relationship is shown for various compositions of the hydrogen peroxide aqueous solution also contained in the cleaning liquid. Similarly to the ammonia water, the composition of the hydrogen peroxide aqueous solution is represented in terms of the volume part against 1000 part deionized water. As is expected, FIG. 3 shows the general tendency of increasing etching of the silicon substrate with increasing content of the ammonia water in the cleaning liquid.

Figure 4:
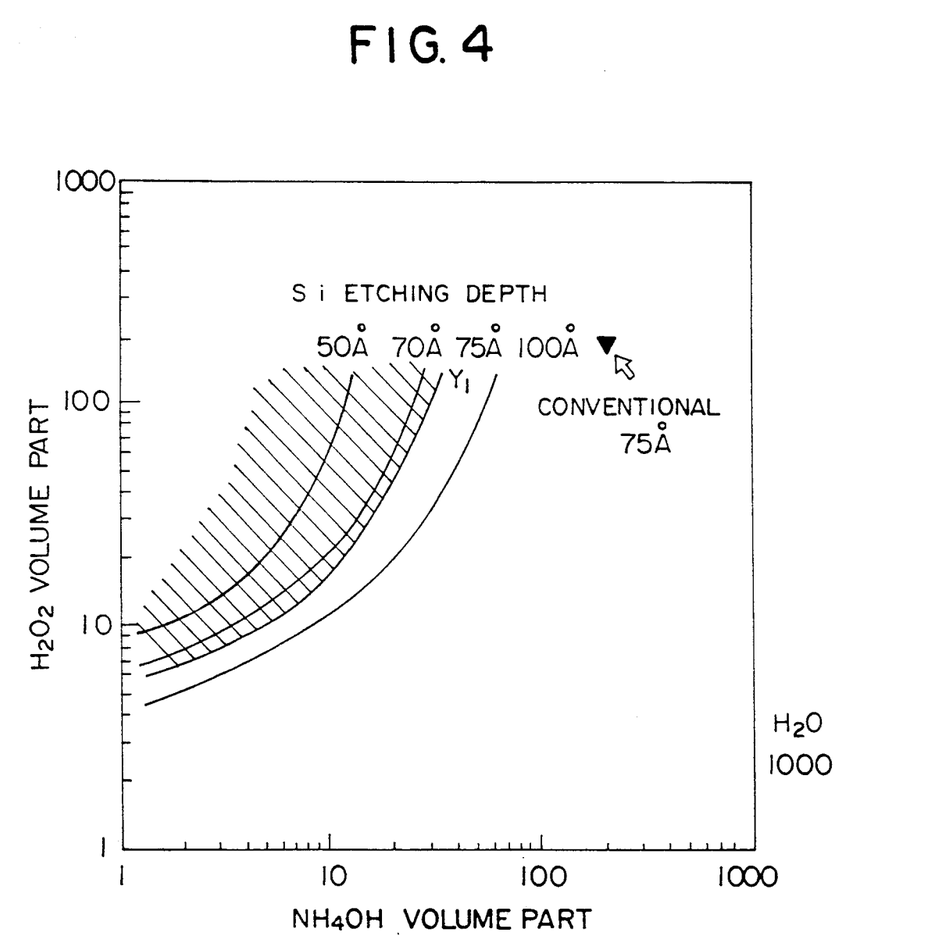
FIG. 4 is a diagram showing the relationship between the volume content of the hydrogen peroxide aqueous solution and the volume content of the ammonia water in the cleaning liquid, with the depth of etching of the silicon substrate as a parameter.

FIG. 4 shows the relationship between the volume part of the hydrogen peroxide aqueous solution and the volume part of the ammonia water in the 1000 part deionized water, for various etching depths of the silicon substrate. Various lines in FIG. 4 represent the depth of etching as a function of the volume part of the hydrogen peroxide aqueous solution and the volume part of the ammonia water, wherein the line represented by Y1 represents a boundary composition wherein the etching depth of 75 Å is obtained. It should be noted that this depth of 75 Å is chosen based upon the comparison with the conventional cleaning liquid that provides the etching depth of 75 Å. The boundary composition Y1 is given approximately as $$Y1 = 4.64 \times 10^{-3} X^3 - 6.22 \times 10^{-2} X^2 + 1.52X + 4.37$$

where Y1 represents the volume part of the hydrogen peroxide aqueous solution with respect to 1000 part deionized water and X represents the volume part of the ammonia water with respect to 1000 part deionized water. Thus, to reduce the etching of the silicon substrate to the depth less than the etching depth of the conventional cleaning liquid, it is preferred to set the composition of the cleaning liquid in the hatched region of FIG. 4 that is located above the boundary composition Y1.

As shown in clearly in FIG. 4, it was found that one can achieve the depth of etching of 75 Å with the reduced volume part for both the ammonia water and the hydrogen peroxide solution in the cleaning liquid, as compared with the conventional liquid. This means that one can obtain the effect of removing the particles from the surface of the substrate while using the cleaning liquid that has a diluted composition as compared with the conventional case. Thereby, one can reduce the consumption of ammonia and hydrogen peroxide and hence the cost of fabrication of the semiconductor device.

Figure 5:
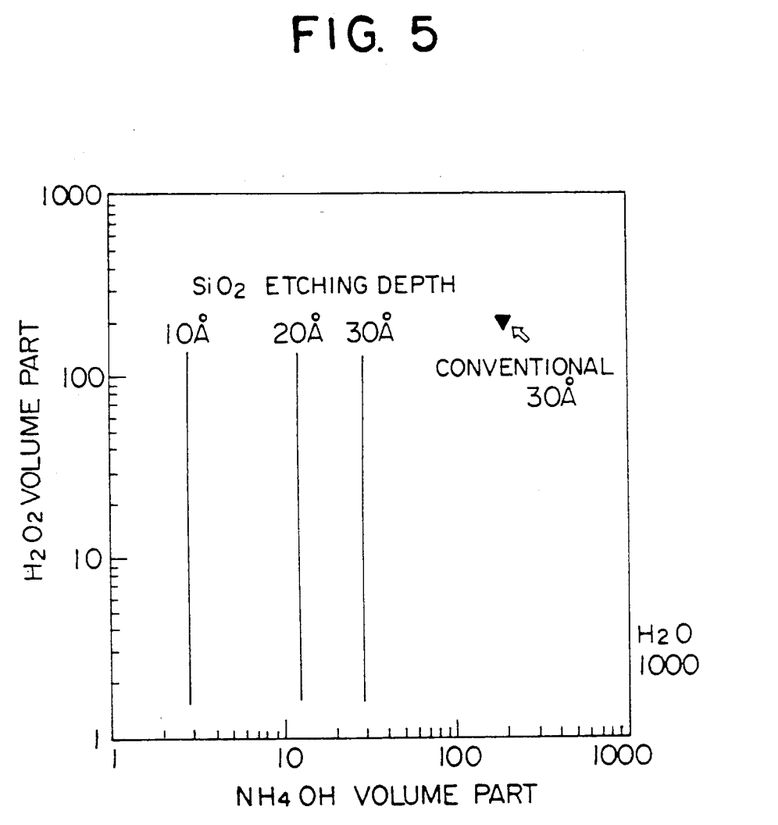
FIG. 5 is a diagram showing the relationship between the volume content of the hydrogen peroxide aqueous solution and the volume content of the ammonia water in the cleaning liquid, with the depth of etching of a silicon oxide layer on the silicon substrate as a parameter.

FIG. 5 shows the relationship between the volume part of the hydrogen peroxide aqueous solution and the volume part of the ammonia water for various etching depths for a silicon oxide film that is formed on a silicon substrate. The silicon oxide film may be formed by the thermal oxidation process of the silicon substrate at 950° C. in the dry oxygen environment. Each line in FIG. 5 shows the depth of etching as a function of the volume part of the hydrogen peroxide aqueous solution and the volume part of the ammonia water. FIG. 5 also shows the conventional composition. In this conventional composition, a depth of 30 Å is achieved. As clearly shown in FIG. 5, this depth of etching of 30 Å is obtained with far smaller use of the ammonia water in the cleaning liquid. In the cleaning of the surface of the silicon oxide film, too, excessive etching is not desired. In order to suppress the depth of etching to the depth less than about 30 Å, one should choose the volume part of the ammonia water in the cleaning liquid to be less than about 30 parts in volume with respect to the 1000 part deionized water.

Figure 6:
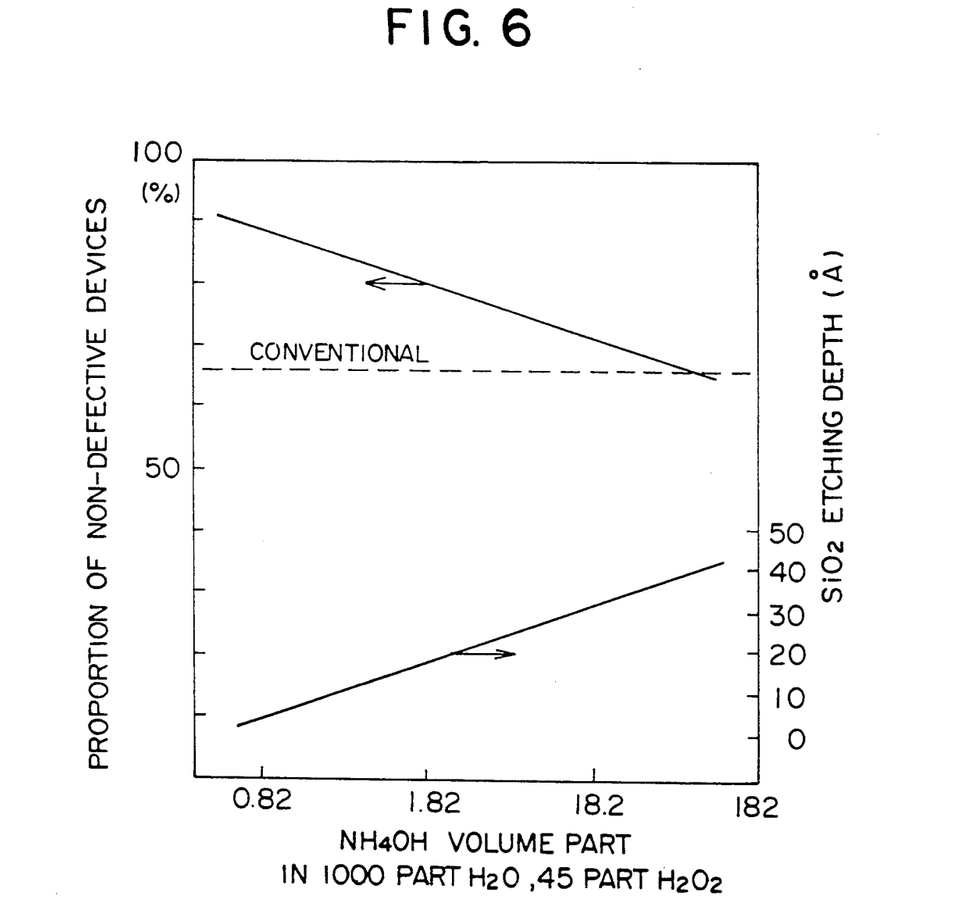
FIG. 6 is a diagram showing the relationship between the fraction of non-defective devices and the volume content of the ammonia solution in the cleaning liquid that is used for cleaning the substrate in the process of fabrication of the device.

FIG. 6 shows the result of the test for the breakdown voltage conducted for the semiconductor devices that have been fabricated by a process in which the step of cleaning the semiconductor substrate by the cleaning liquid is included. In FIG. 6, the ordinate at the left represents the percentage of non-defective devices that satisfy the requirement of having the breakdown voltage larger than 8 MV/cm. The ordinate at the right, on the other hand, represents the depth of etching of the silicon oxide film on the substrate that was achieved by the cleaning. Further, the abscissa represents the volume part of the ammonia water in 1000 part deionized water. The process of fabrication of the device will be described later with reference to FIGS. 7(A)-7(D).

As clearly shown in FIG. 6 by the upper line, the proportion of the non-defective devices decreases generally with increasing volume part of the ammonia water in the cleaning liquid. This effect is attributed to the increased etching of the silicon oxide film on the substrate as shown by the lower line of FIG. 6. Conventionally, a proportion of the non-defective devices of about 66% has been achieved. By setting the volume part of the ammonia water to be at least smaller than about 90 parts, preferably smaller than about 30 parts, one can safely avoid the excessive etching of the silicon oxide film on the substrate and the proportion of the non-defective devices exceeding the conventional proportion of about 66% is guaranteed.

FIGS. 7(A)-7(E) are diagrams showing the process for fabricating a semiconductor device that is used in the breakdown voltage test of FIG. 6.

Figure 7A:
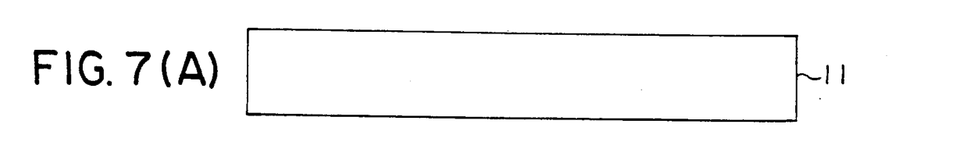
FIGS. 7(A)-7(E) are diagrams showing the process for fabricating a semiconductor device including the step for cleaning the semiconductor device in the cleaning liquid of the present invention.

Referring to FIG. 7(A), a silicon substrate 11 having a (100) upper major surface and doped to the p-type with the resistivity of about 10 Ωcm is oxidized at 950° C. in dry oxygen environment to form a thin oxide film 12 such that the film 12 covers the upper major surface of the substrate 11. See FIG. 7(B). The silicon oxide film 12 is grown with a thickness of about 250 Å.

Figure 7B:
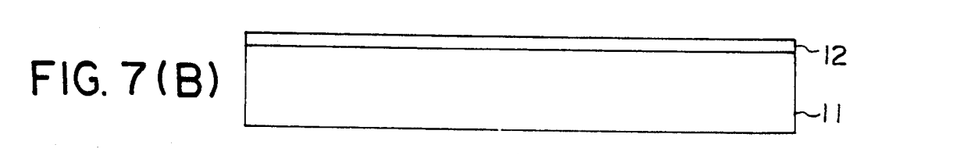
Figure 7C:
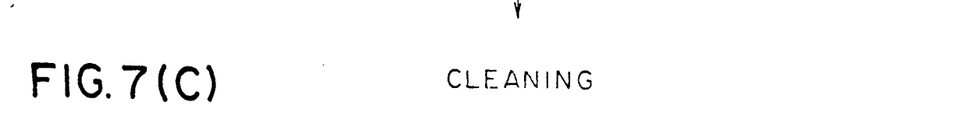

Next, the substrate of FIG. 7(B) is cleaned in the step of FIG. 7(C) in the cleaning liquid of the mixture of the ammonia water, hydrogen peroxide aqueous solution and deionized water as described already. The cleaning liquid is held at 80° C., and the substrate is dipped for about 10 minutes. After pulling out from the cleaning solution, the substrate is rinsed for 10 minutes in the deionized water and dried subsequently for 15 minutes. It should be noted that, in the diluted cleaning liquid as in the liquid of the present invention, the efficiency of cleaning decreases when the temperature of the liquid is lower than 60°. Because of this reason, the cleaning is made in the liquid that is held at a temperature higher than 60° C. Preferably, the liquid is held at 80° C. as described above.

Figure 7D:
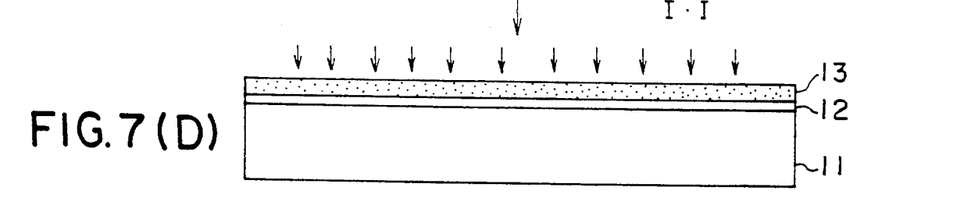
Figure 7E:
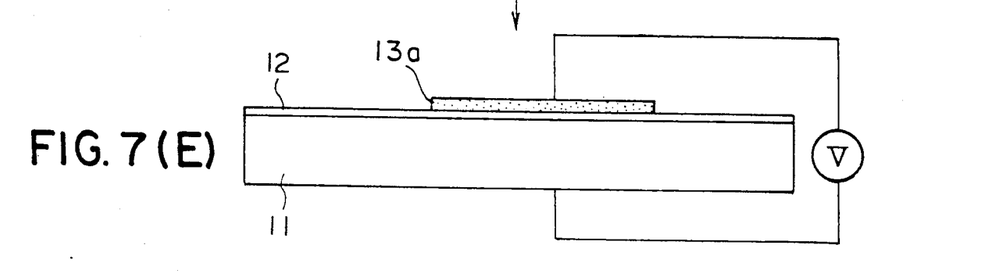

Next, in the step of FIG. 7(D), a polysilicon layer 13 is deposited on the upper major surface of the silicon oxide film 12. After an ion implantation process of dopants and subsequent diffusion to provide conductivity, the polysilicon layer 13 is patterned to form a polysilicon electrode 13a as shown in FIG. 7(E). Thereby, the device for the experiment is completed. In the present experiment, the polysilicon electrode 13a was formed to have a surface area of 9 mm$^2$. The breakdown voltage of the silicon oxide film 12 was measured by applying a voltage across the polysilicon electrode 13a and the silicon substrate 11 as illustrated in FIG. 7(E). It should be noted that FIG. 6 represents the result of the test such that the apparent change in the breakdown voltage caused by the reduction of the thickness of the silicon oxide layer by the etching is eliminated.

Figure 8:
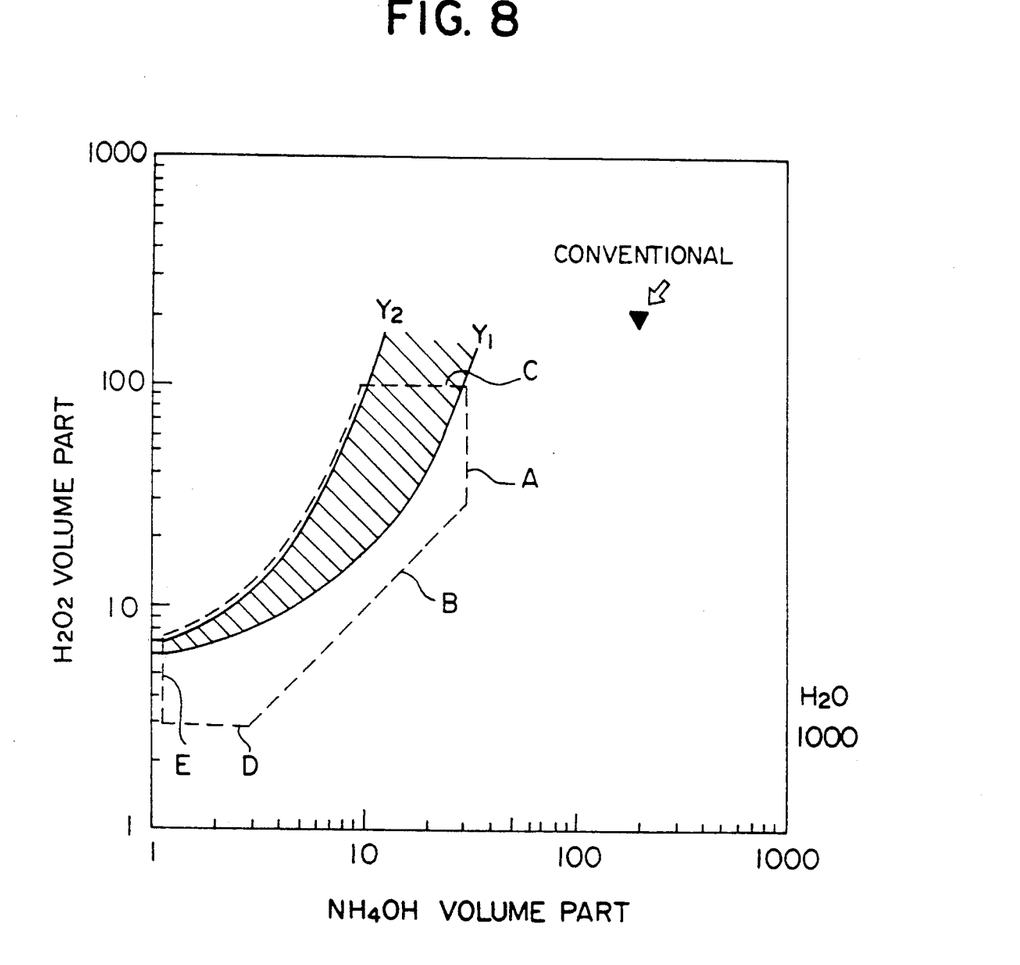
FIG. 8 is a diagram showing the preferred range of composition of the cleaning liquid according to the present invention.

FIG. 8 shows the preferable range of the volume parts of the hydrogen peroxide and ammonia waters against the 1000 volume parts of the deionized water. In FIG. 8, the boundary composition defined by the curves Y1 and Y2 are shown.

From the foregoing experiment of FIG. 5 about the etching of the silicon oxide film on the substrate and the breakdown voltage, the volume part of the ammonia water is preferably set smaller than a boundary A that coincides with the 30 part composition of the ammonia water. Further, in order to avoid the rough surface formed at the surface of the silicon oxide film as a result of the etching by the ammonia water, it is preferred to set the volume part of the ammonia water to be smaller than a boundary B that represents the 1:1 ratio of the ammonia water and the hydrogen peroxide solution. More preferably, the volume part of the ammonia water is set smaller than the boundary composition given by the curve Y1.

From the view point of efficient separation and removal of the particles from the substrate, on the other hand, it is preferable to set the volume part of the ammonia water at the composition larger than the boundary composition given by the curve Y2. It should be noted that the boundary composition Y2 provides the efficiency of cleaning of about 95% for silicon oxide particles. Hence, by setting the value part of the ammonia water to be larger than the boundary composition Y2, one can guarantee the efficiency of removal larger than 95%.

The upper boundary of the volume part of the hydrogen peroxide solution is limited by the aluminum ions that are contained in the hydrogen peroxide aqueous solution as a byproduct. Thus, when the volume part of the hydrogen peroxide aqueous solution is too much, there is a risk of the aluminum ions cause unwanted short circuit in the semiconductor device. In the present invention, the volume part of the hydrogen peroxide aqueous solution is set smaller than a line C that represents the composition of the hydrogen peroxide aqueous solution of 100 part against the 1000 part deionized water. Thereby, one can reduce the number of aluminum ions deposited on the substrate to be less than $20 \times 10^{10}$ cm$^{-2}$.

Further, in order that the cleaning liquid be effective for separating the particles, the cleaning liquid cannot be diluted excessively. In other words, there exists a lower boundary in the volume part of the hydrogen peroxide aqueous solution as represented by a line D that is generally coincident to the volume of about 3 parts against the 1000 part deionized water. Similarly, there exists a lower boundary in the volume part of the ammonia water as represented by a line E that is generally coincident to the volume ratio of about 1 part against the 1000 part deionized water.

The present invention provides a process for fabricating a semiconductor device, wherein the process includes a step for cleaning a semiconductor substrate by dipping the semiconductor substrate into a cleaning liquid that has a composition falling in the range surrounded in FIG. 8 by the line Y2 and the lines A-E. As described heretofore, one can maximize the efficiency of cleaning while suppressing the excessive etching of the substrate and hence the degradation of the breakdown voltage of the silicon oxide films formed on the substrate, by setting the composition of the cleaning liquid to fall in the foregoing range. Further, the contamination of the substrate by the aluminum particles is minimized. Particularly, the composition located between the two lines Y1 and Y2 is preferred in order to achieve the optimum result.

Further, the present invention is not limited to the embodiments described heretofore, but various variations and modifications may be made without departing from the scope of the invention.

What is claimed is:

1. A method for fabricating a semiconductor device, comprising the steps of:
   cleaning a semiconductor substrate in a cleaning liquid essentially consisted of a mixture of an ammonia water having a composition of 29 percent by weight, a hydrogen peroxide aqueous solution having a composition of 31 percent by weight and a deionized water, said cleaning liquid containing the ammonia water and the hydrogen peroxide aqueous solution with respective volume parts such that the volume part of the ammonia water is set equal to or smaller than 30 parts with respect to the deionized water of 1000 parts, said volume part of the ammonia water being set equal to or smaller than the volume part of the hydrogen peroxide aqueous solution, said volume part of the hydrogen peroxide aqueous solution being set equal to or smaller than 100 parts with respect to the deionized water of 1000 parts, said volume part of the hydrogen peroxide aqueous solution being further set equal to or smaller than a boundary composition Y2 represented as $$Y_2 = 0.25X^3 - 2.75X^2 + 13.5X - 10,$$

where X represents the volume part of the ammonia water in 1000 parts of said deionized water;
   rinsing the semiconductor substrate that has been cleaned in the cleaning liquid; and
   drying the semiconductor substrate.

2. A method as claimed in claim 1 in which said volume part of the hydrogen peroxide aqueous solution is set equal to or larger than 3 parts with respect to the deionized water of 1000 parts.

3. A method as claimed in claim 1 in which said volume part of the ammonia water is set equal to or larger than 1 part with respect to the deionized water of 1000 parts.

4. A method as claimed in claim 1 in which said volume part of the hydrogen peroxide aqueous solution is set equal to or larger than a boundary composition Y1 represented as $$Y1 = 4.64 \times 10^{-3} X^3 - 6.22 \times 10^{-2} X^2 - 1.52 X + 4.37$$

where X represents the volume part of the ammonia water with respect to the deionized water of 1000 parts.

5. A method as claimed in claim 1 in which said cleaning liquid is held at a temperature higher than 60° C. in the step of cleaning the semiconductor substrate.

6. A method as claimed in claim 1 in which said semiconductor substrate has a surface of crystal silicon, said cleaning liquid cleaning the surface of crystal silicon in said step of cleaning.

7. A method as claimed in claim 6 in which said semiconductor substrate comprises silicon.

8. A method as claimed in claim 1 in which said semiconductor substrate has a surface of silicon oxide, said cleaning liquid cleaning the surface of silicon oxide in said step of cleaning.

* * * * *